United States Patent [19]
Goodman et al.

[11] Patent Number: 5,159,172
[45] Date of Patent: Oct. 27, 1992

[54] OPTICAL PROJECTION SYSTEM

[75] Inventors: Douglas S. Goodman; Alan E. Rosenbluth, both of Yorktown Heights, N.Y.; Raymond E. Tibbetts, Cape Coral, Fla.; Janusz S. Wilczynski, Ossining, N.Y.

[73] Assignee: International Business Machines Corporation, Armonk, N.Y.

[21] Appl. No.: 564,007

[22] Filed: Aug. 7, 1990

[51] Int. Cl.[5] .............................................. B23K 26/00
[52] U.S. Cl. .......................... 219/151.68; 219/121.76; 359/858
[58] Field of Search ...................... 219/121.68, 121.69, 219/121.76; 355/43, 53, 60, 66, 65; 350/615, 601, 602

[56]         References Cited
       U.S. PATENT DOCUMENTS

| | | | |
|---|---|---|---|
| 2,628,533 | 2/1953 | Oetjen | 350/619 |
| 3,689,159 | 9/1972 | Taniguchi et al. | 356/123 |
| 3,902,036 | 8/1975 | Zaleckas | 219/121.85 |
| 3,951,546 | 4/1976 | Markle | 350/55 X |
| 4,241,390 | 12/1980 | Markle et al. | 362/55 |
| 4,584,455 | 4/1986 | Tomizawa | 219/121.68 |
| 4,622,564 | 11/1986 | Kaku et al. | 346/160 |
| 4,749,840 | 6/1988 | Piwczyk | 219/121.68 |
| 4,780,177 | 10/1988 | Wojnarowski et al. | 156/643 |

FOREIGN PATENT DOCUMENTS 52-58196  5/1977  Japan.

*Primary Examiner*—C. L. Albritton
*Attorney, Agent, or Firm*—Daniel P. Morris

[57]           ABSTRACT

An optical system having a plurality of substantially planar reflecting surfaces and a plurality of curved reflecting surfaces providing an optical projection system which can scan a mask object onto an image plane by having the mask and copy substrate substantially fixed in position relative to each other and either simultaneously moving the mask and copy substrate in the same direction or maintaining the mask and image plane substantially stationary and fixed with respect to each other while scanning the optical system. The optical system uses one wavelength of an electromagnetic radiation to align the mask to the copy substrate and another wavelength of electromagnetic radiation to form the image of the mask on the copy substrate. The apparatus can be used as a laser ablation optical tool to laser ablate the image of a mask onto the copy substrate, as an inspection tool, as a photolithographic and for other related applications. The projection lens is a modified Dyson type lens.

26 Claims, 3 Drawing Sheets

5,159,172

OPTICAL PROJECTION SYSTEM

FIELD OF THE INVENTION

This invention relates to an optical apparatus for projecting an object image onto a substrate wherein the apparatus uses electromagnetic radiation of a first wavelength to align the object and image planes and uses a second wavelength to project an image of the object onto the image plane. More particularly, the present invention relates to an apparatus containing a roof mirror from which the alignment and image beams are reflected towards two spaced apart concave reflecting surfaces from which the alignment and image beams are reflected to a planar mirror and therefrom onto a substrate. Most particularly, the present invention is directed to an apparatus for using one wavelength of light to align a mask to a substrate and another wavelength of light to laser ablate the image of the mask onto a polymeric layer or to form an exposed image on the substrate.

BACKGROUND OF THE INVENTION

Photolithographic tools are common place in the microelectronics industry. In a photolithographic tool a mask is placed at an object plane of the lens. The mask is potentially non-transmitting to the frequencies of electromagnetic radiation used in the tool and has a predetermined pattern which transmits these frequencies. An image of the mask is produced by the photolithography lens onto a substrate which is generally a resist covered electronics chip or chip packaging substrate. Those regions of the resist which are exposed to the image forming radiation have a latent image of the mask pattern formed therein. Either the exposed or non-exposed regions of the resist are removed by development process to form a resist mask through which the substrate is etched to form a pattern in the substrate. Also, the photolithographic system can be used to directly ablate the image of the mask onto an ablatable surface. The ability to directly ablate a pattern onto a surface reduces the cost of fabrication since there can be fewer process steps, for example, the steps in depositing and removing a resist mask are eliminated. The optical system according to the present invention permits the direct ablation of a mask pattern onto an ablatable surface, in particular, a polyimide surface.

Commonly used photolithographic tools generally use a system of lenses which rotates the image 180° relative to the object. In some photolithographic tools, the object field contains the total object which is to be imaged onto a substrate. This image of the entire object can then be stepped across the substrate to form repeated pattern of the object. If the object is be imaged is larger than the image field of the lens, to completely print the object requires that the object and the image field be moved in the opposite direction since the image plane is 180° rotated with respect to the object plane. This is a relatively complex procedure since the image and the object cannot be held fixed in position relative to each other. One way to avoid this is to add to the photolithographic system another complete set of optics which will rotate the image another 180°, the final image being rotated 360° with respect to the object. With such a double sized optical system, where the object to be imaged is greater than the image field of the system, the object plane and the image plane can be fixed relative to each other and scanned relative to the lithographic system to form a complete image of the object. However, adding a duplicate set of lenses to rotate the image another 180° substantially increases the cost complexity and size of the photolithographic system.

Applicants have discovered a new projection lens which also permits scanning the image and object fields together without requiring a substantial increase in the complexity of the system.

One use of applicant's lenses is for a system to ablate the image of the object mask onto an ablatable surface. Laser tools for milling a work piece are known in the prior art.

It is an object of the present invention to provide an image at the image plane having the same orientation as the object and to provide an apparatus which can scan the object and image together.

U.S. Pat. No. 4,749,840 to Piwczyk describes an optical system using lenses and a flat mirror for ablative photodecomposition of a polymer surface using a beam of ultraviolet light from an excimer laser. The beam is aligned to the location to be ablated by irradiation with visible light which is optically observed through an eye piece. Pickwick does not use curved reflecting surface having substantially coincident axes as in the present invention. Moreover, the alignment of the workpiece is by visual observation. In contradistinction, the apparatus of the present invention uses an alignment beam which does not have to be visually observable.

U.S. Pat. No. 4,584,455 to Tomizawa describes a laser beam irradiating apparatus which includes a working laser beam for machining a workpiece coupled to a visible laser beam which is made coincident therewith. The visible laser beam is detected by a camera for positioning the workpiece. The apparatus contains planar reflecting surfaces but not curved reflecting surfaces. The visible laser beam is monitored by a camera to determine the location of the machining beam on the workpiece.

U.S. Pat. No. 3,689,159 to Taniguchi et al. describes a laser shaping apparatus for automatically shaping a workpiece with a laser and for providing automatic controls so that the focal point of the laser light which is focused by a lens always corresponds with point on the workpiece which is being shaped.

U.S. Pat. No. 3,951,546 to Markle describes a IX projection lens which permits scanning the image and object fields together. Markle describes a three-fold mirror array for scanning projection system having an image orientation for a scanning and yielding an image symmetry identical to that obtained in contact printing. The three fold mirror array is provided with a pair of mutually perpendicular reflecting plane faces which constitute a roof. The line of intersection of the roof surfaces is perpendicular to the third planar reflecting surface of the three fold mirror combination. The system contains two concentric curved mirrors, one of which is concave, the other of which is convex. An object, e.g. a mask, is illuminated. The light goes through the mask onto the third planar surface from which it reflects to the concave mirror, from which it reflects into the convex mirror, from which it reflects back to the concave mirror, from which it appears to straddle the dihedral angle of the roof mirror, from which it reflects to the image plane, e.g. a semiconductor wafer. The Markle system has an even number of reflections, and the planar mirror surfaces are mutually orthogonal so that the object and image planes are parallel, therefore, the mask image at the image plane has the same orientation as the mask at the object plane. The mask and wafer can be scanned together. The combination of the three-fold mirror, concave mirror and convex mirror form a IX projection lens for the Markle scanning projection system. The Markle lens uses the Offner lens which is the concave/convex mirror combination of U.S. Pat. No. 4,241,390 to Markle and Offner. The Offner lens is not corrected for an axis aberration, but is corrected on a specific annular field. Good imaging at the image plane occurs only in a thin anular region In contradistinction, the lens of the present invention is corrected for aberrations, in a region including and around the axis. The region of good imaging according to the present invention is not limited to an annular field. To achieve the same useful region of good imaging using the Offner system requires that the Markle lens be substantially increase in size so that the useful area of the present invention fits into the annular ring of the Markle lens. This situation is schematically shown in FIG. 1. Region 1, shown as a circle, represents the field of good imaging of the lens system of the present invention. To achieve this same region the Markle lens system will have to have annular region 3 as the region of good imaging. This requires substantially large optical elements. Region 1 is not limited to a circular region, but can be square, rectangular, triangular, or any other geometrical figure that fits in the region of aberration correction.

It is another object of the present invention to provide a projection lens for which the region of good imaging is not limited to an annular region.

It is another object of the present invention to provide a projection lens having a large area of good imaging.

It is another object of the present invention to provide an apparatus for ablating in a substrate surface an image having the same orientation as the object projected by the apparatus.

It is another object to provide an ablation aperture which aligns mask to substrate with one wavelength and ablates with another wavelength of radiation.

These and other objects and features of this invention will become apparent from the following more detailed description of the preferred embodiments and the figures appended thereto.

SUMMARY OF THE INVENTION

This invention relates to an apparatus for projecting an image of an object onto a substrate wherein the apparatus has a plurality of substantially planar reflecting surfaces and a first and second curved reflecting surface. The axis of the first and second curved surfaces are substantially coincident. The vertices are spaced apart by a predetermined distances. An object in the object plane is illuminated by electromagnetic radiation which reflects off of one of the plurality of planar surfaces toward one of the curved surfaces from which it is reflected to another of the planar surfaces from which it is reflected onto a substrate in the image plane.

In a more particular aspect of the present invention two beams of different wavelengths are used. One wavelength is for aligning the object to the substrate and the other wavelength is for forming an image of the object on the substrate. The spacing between the first and second curved surfaces permit the object and image planes for both the alignment and image forming beams to be substantially at the same locations. Moreover, the curvatures of the curved surfaces permit aberration correction.

It is another object of the present invention to use refracting elements.

In another more particular aspect of the present invention, the object is a mask which is imaged onto the image plane at the surface of an electronic device.

In another more particular aspect of the present invention, the radiation is UV light provided by an excimer laser.

In another more particular aspect of the present invention, the image plane contains an ablatable material onto which the pattern of the object is ablated.

In another more particular aspect of the present invention, the image plane contains a substrate with a resist thereon in which the image forming beam forms a image of the object in the object plane.

DETAILED DESCRIPTION OF THE PREFERRED EMBODIMENT

Figure 1:
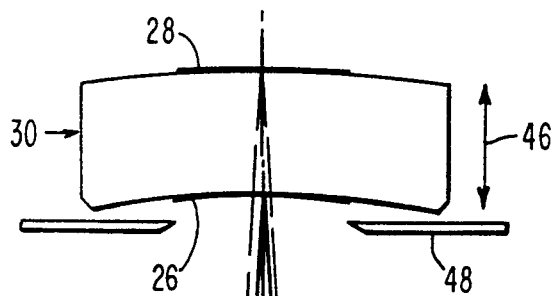
FIG. 1 is a schematic comparison of a field of good imaging according to the present invention with the field of good imaging of an annular, projection system.
Figure 2:
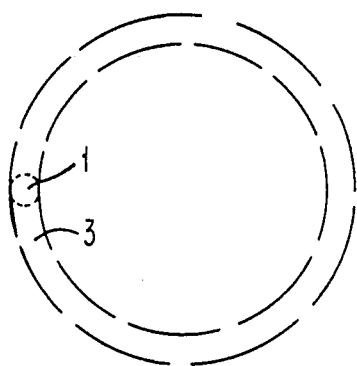
FIG. 2 is a schematic drawing of a side view of the apparatus according to the present invention.
Figure 2:
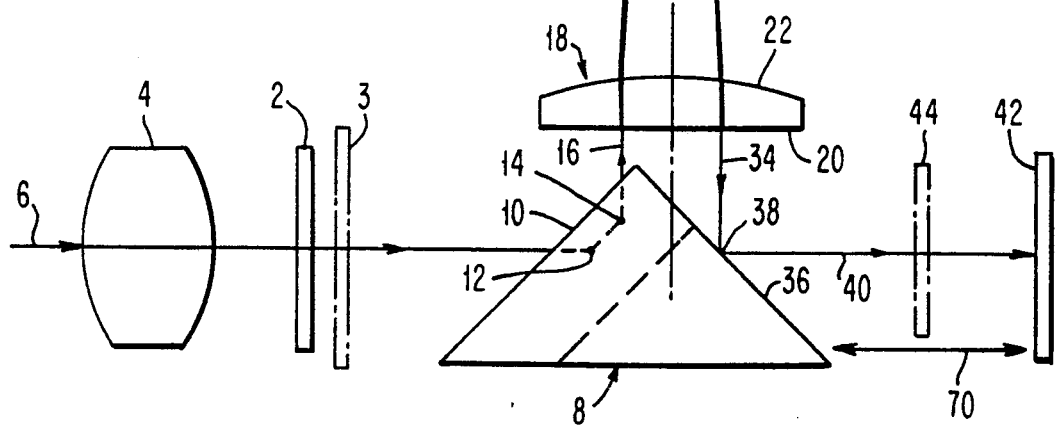

FIG. 2 shows a schematic side view of the optical system or lens according to the present invention. The optical system according to the present invention is a variation of the Dyson system. The preferred embodiment of the present invention is a 1X projection system for a laser ablation tool. In the preferred embodiment when the present invention is used in an ablation tool, these deviations provide space to avoid accumulating ablation debris on the lens elements. The most significant deviations from the Dyson system are a large working distance and the use, of a thin plano-convex field lens. In FIG. 2, the object 2 to be imaged is preferably a mask fabricated from a material which is opaque to the wavelengths of electromagnetic radiation used. The mask has a predetermined pattern of regions which transmit the wavelengths of radiation used in the optical system. The object is illuminated by the illuminating system schematically represented by 4. The illuminating system 4 are commonly used in the art and are generally a collection of optical elements which provides uniform illumination of the object 2. The illuminating system can be selected to give uniform illumination at the mask plane and the proper angular distribution. Internal to the illuminating system or at the output of the illuminating system there can be an illuminating field stop to form any desired illumination region, for example, circular, square, diamond, polygonal etc.. Part of the beam 6 passes through illuminating system 4 and mask 2 and is incident on optical element 8 which is shown in perspective in FIG. 3. Beam 6 is incident on surface 10 of optical element 8 at point 12. The beam reflects from point 12 to point 14 on surface 16 of optical element 8. After reflecting from point 14, beam 6 represented as 16 is preferably passed through lens 18 which is most preferably, a plano-convex lens having planar surface 20 and convex surface 22. Lens 18, inter alia corrects astigmatism of the curved mirror and makes the optical system doubly telecentric. In the preferred embodiment, mask 2 is 121,2 mm from surface 20 which is planar; surface 20 is 17.3 mm from surface 22 which has a radius of curvature of 185.58; surface 22 is 376.54 mm from surface 26 which has a radius of curvature 565.72 mm, surface 26 is 29.98 mm from surface 28 which has a radius of curvature of 592.55 mm, lens 18 is fused quartz and double mirror 30 is of fused quartz. Beam 16 passes through lens 18 and becomes beam 24 which is directed onto one of the surfaces 26 and 28 of double mirror 30. The concave surface 26 of double mirror 30 is substantially located at the prime focus of the lens 18 at a actinic predetermined wavelength. The beam 24 reflects back off of surface 26 as beam 32 through the lens element 18 as beam 34 and onto surface 36 of optical element 8 and reflects from point 38 on surface as beam 40 towards copy surface 42. Between copy surface 42 and the remainder of the optical system there is disposed a window 44 which is transparent to the radiation which prevents contamination of the optical system, for example, from debris generated by beam 40 incident on the surface 42. The protective window is preferably a plane parallel quartz plate. The system can also have an input window, such as 3 in FIG. 2, so that the system can be filled with a gas such as $N_2$ or to prevent contaminants from entering the system.

In the preferred embodiment, the apparatus of FIG. 2 is used to form the image of mask 2 by ablation onto an ablatable copy surface 42, for example, a polymer surface such as a perfluorinated polymer surface and the like, polyimide surface 42. For a polyimide surface an ablating wavelength is 308 nm which has been found to readily ablate the polyimide (what type of polyimide?) surface and quite easily can form features in the polyimide surface as small 8 microns. For a perfluorinated polyimide, e.g., Teflon ® (DuPont) the ablation wavelength can be 248 mm or 193 nm. Teflon melts at three wavelengths; a hole can be melted at high fluences, e.g., $>5J/cm^2$, and ablates at these wavelengths using sub picosecond pulses, e.g. $<100$ mJ/cm$^2$. Concave surface 26 of double mirror 30 is chosen to have a surface which will reflect the exposing or ablating wavelength. Dielectric and dichroic mirror coating reflecting at these wavelengths are commonly known in the art.

The object 2 is aligned to the copy surface 42 by using a beam 6 at a non-exposing or nonablating wavelength. For example, a wavelength of 546 nm, for example, from a mercury lamp, is chosen. In the preferred embodiment, the alignment beam passes through mirror surface 26 and reflects off of concave surface 28 of double mirror 30. Preferably, surface 28 transmits the exposing or ablation wavelength. The aligning wavelength does not ablate or expose the copy surface 42. The double mirror 30 is preferably made of fused quartz. The spacing 46 between the concave surface 26 and 28 and their curvatures are chosen to allow both the exposing and the alignment beams to have parfocal images at copy surface 42. In the preferred embodiment the exposing or ablating wavelength reflects off of surface 26 and alignment wavelength reflects off of surface 28. However, for some other alignment and exposing frequencies the order of the alignment and exposing curved surfaces could be reversed. Surface 26 and material 30 must permit at least a fraction of the radiation reflecting off of surface 28 to pass therethrough.

For resolution requirements, the alignment NA (numerical aperture) may be greater than the exposing or ablation NA which may necessitate a slight aspherization of the convex surface which reflects the alignment beam to achieve spherical aberration correction. An iris 48 is set at one aperture for the exposing beam and may be opened to a larger aperture during the alignment wavelength exposure to increase the NA for the alignment. When the alignment wavelength is greater than the exposing or ablating wavelength, it is desirable to increase the numerical aperture to maintain the same resolution for the alignment and the exposing or ablating beam.

Figure 4:
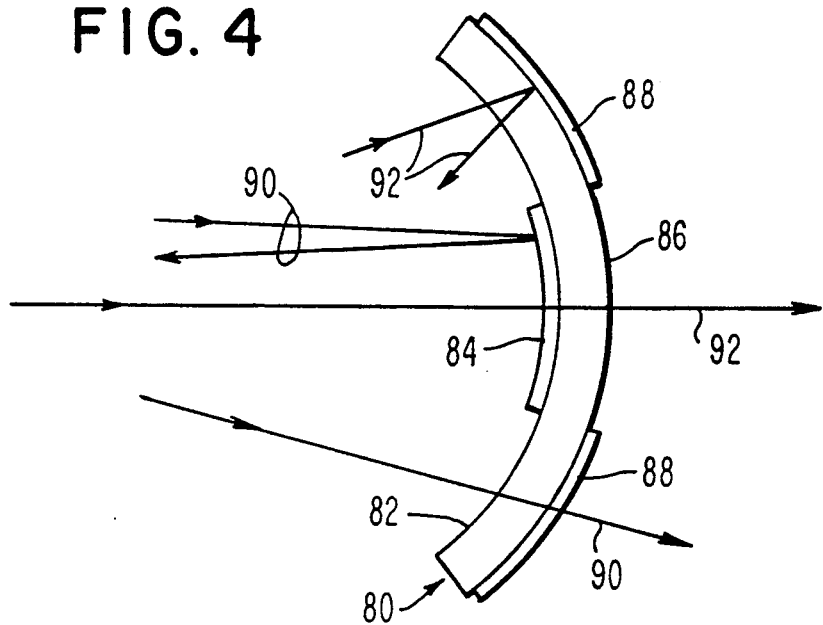
FIG. 4 is a schematic view of an embodiment of the double mirror of the apparatus of FIG. 1.

FIG. 4 shows another embodiment of a double mirror. Using this double mirror, the apparatus of the present invention does not have to use an iris as shown in FIG. 2. Double mirror 80 has first concave surface 82 with a circular region 84 which reflects an exposing or ablating beam 90 and which transmits the alignment beam. Double mirror 80 has a second concave surface 86 with an annular coated area 84 which reflects the alignment beam 92 and transmits the exposing or ablating beam 90. Coating 84 on surface 82 transmits the alignment beam which passes through double mirror 80 and through that part of surface 86 not covered by coating 88. Alternatively, surface 86 can have a continuous coating which transmits the exposing or ablating wavelengths. With this arrangement, the pupil is circular for the exposing or ablating wavelength and is either circular or annular for the alignment wavelength. Use of coating as shown in FIG. 4 will result in a larger numerical aperture for the alignment beam then for the exposing or ablating beam.

Figure 3:
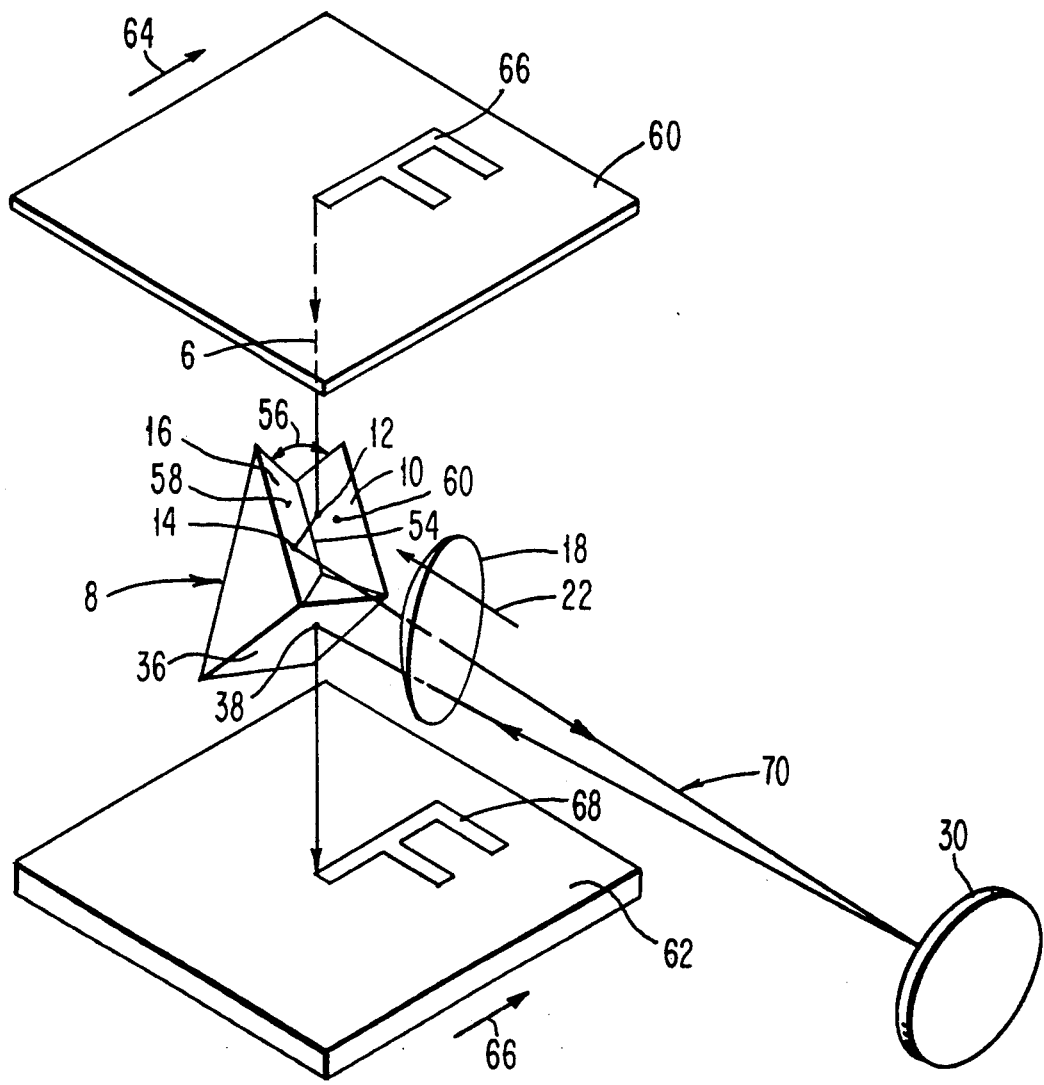
FIG. 3 is a schematic partial perspective view of the apparatus according to the present invention.

The optical element 8 shown in perspective in FIG. 3 has a roof mirror and another planar mirror. Since surfaces 10 and 16 intersect along line 54 and have an angle therebetween. In the preferred embodiment angle 56 is 90° and line 54 is perpendicular to planar surface 36 to form three mutually orthogonal surfaces. When the three planar mirrors are mutually orthogonal the orientation of element 8 is not critical to achieve image with the same orientation as the object as shown in FIG. 3. If the planar surfaces are not mutually orthogonal the orientation of element 8 is critical to obtain an image with the same orientation as the object. Each one of the reflecting surfaces 10, 14 and 36 can be distinct and separate reflecting surfaces not connected together in one optical element such as shown in the preferred embodiment.

Although surface 10 and 16 of optical element 80 are shown joined along line 54 it is not necessary that they be joined. The entire image forming bundle 6 strikes first one face 10 and then the second face 12 of the roof mirror. This serial use of the roof mirror, instead of straddling the dihedral angle 56 allows greatly reduced fabrication tolerances. The use of the roof mirror provides a second unused optical path where an optical beam such as 6 could strike surface 16 first, for example at a point 58 and then strike surface 10, for example at point 60 before it is directed towards double mirror 30. This second path could be used as an alignment path.

The mask can be aligned to the copy substrate by aligning the image of alignment marks on the mask with alignment marks on the copy substrate. Alternatively, the copy substrate can be illuminated and the image of the substrate alignment marks can be viewed through the mask alignment marks to align the image to the mask marks.

In the preferred embodiment of the present invention the optical system is stationary while the mask and copy surface moved together in their respective object and image planes. Most preferably, the mask and copy surface are disposed on a means movable with respect to the lens of the present invention. In this manner, the pattern on the mask is projected onto the copy surface by stepping and scanning. Alternatively, the mask and copy planes can be stationary while the optical system moves in the scanning direction. Means for scanning the mask and copy planes or for scanning the optical system are known in the art. Markle shows a projection apparatus in which the lens of the present invention can be used. The teaching of U.S. Pat. No. 3,951,546 is incorporated herein by reference.

The object 60 and the substrate 62 can be scanned together in the same direction 64 and 66 respectfully. The image of the object 66 of FIG. 2 can be scanned onto the substrate 62 as image 68. Directions 64 and 66 are exemplary. The scan motion can be any direction. The image can be raster scanned onto the substrate.

The mask patterns in the object plane 60 can have any shape, circular, rectangular, hexagonal and polygonal of higher order. Both truncated and open diamonds or bars having 90° corners are possible. Additionally, the complete optical system may be employed for other procedures in addition to ablation, such as photolithography, circuit inspection, repair and the like.

In a preferred embodiment the frequency of light 308 nm and from a mercury arc lamp can be provided by an excimer laser and 546 nm can be provided by a mercury arc lamp. Both sources are commonly used in the art.

The apparatus of the present invention has some notable departures from the classic Dyson system. The present invention uses a thin plano convex lens whereas the Dyson system uses a thick plano convex lens. The present invention differs from other inventions of the Dyson type systems such as using first surface mirrors instead of a prism with total internal reflection. A high power excimer laser could be detrimental to an excessive fused silica thickness, so mirrors are preferred over the usual thick prisms.

Since relatively large mechanical clearance distances 70 are desirable for a processing chamber in which to contain and remove contaminants produced during an ablation process, there is a preferred order of the mirrors. The roof mirror, being physically large, is preferably located at the entering side of the optical system. The flat mirror 36 is preferably located at the exiting side since it does not require protruding roof corners. This type of an arrangement allows a greater mechanical clearance adjacent to the copy substrate which is an important feature.

Ablatable materials useful to practice the present invention include polymers, such as polyimides and perfluorinated polymers which are commonly known in the art. Ablatable materials include ceramics, semiconductors, glasses, polymers and metals.

Figure 5:
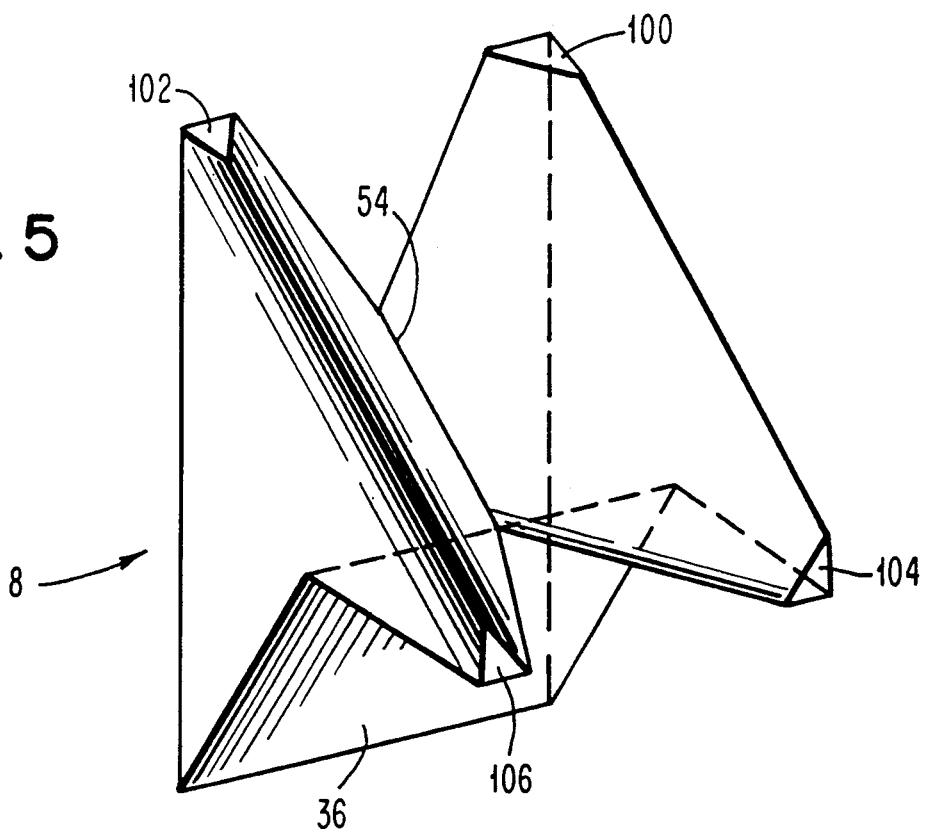
FIG. 5 is an exploded view of an embodiment of the triple mirror of the apparatus of FIG. 1.

FIG. 5 shows an exploded view of the preferred shape of optical elements 8. The roof mirror has protruding parts 100, 102, 104 and 106. This permits the maximum utilization of the lens 18, one half of which is for the beam incident on the roof mirror and the other half of which is for the beam reflected from the roof mirror.

It is to be understood that the above-described embodiments are simply illustrative of the principles of the invention. Various other modifications and changes may be devised by those of skill in the art which will embody the principles of the invention and fall within the spirit and scope thereof.

Having thus described the invention, what we claim as new and desire to secure by letter patent is:

1. An optical apparatus for projecting a beam of electromagnetic radiation comprising:
   a first substantially planar reflecting surface;
   a second substantially planar reflecting surface;
   a first concave curved reflecting surface;
   a second concave curved reflecting surface;
   the axis of said first and said second curved reflecting surfaces being substantially coincident;
   the orientation of said first and said second curved reflecting surfaces having the same orientation;
   said first and said second curved reflecting surfaces being spaced apart by a predetermined distance;
   one of said first and said second substantially planar reflecting surfaces being adapted to receiving said beam of electromagnetic radiation and reflecting said beam to at least one of said first and said second curved reflecting surfaces from which said beam is reflected to the other of said first and said second substantially planar surfaces.

2. An optical apparatus for projecting a beam of electromagnetic radiation comprising:
   a first substantially planar reflecting surface;
   a second substantially planar reflecting surface;
   a first concave curved reflecting surface;
   a second concave curved reflecting surface;
   the axis of said first and said second curved reflecting surfaces being substantially coincident;
   said first and said second curved reflecting surfaces being substantially coincident;
   said first and said second curved reflecting surfaces being spaced apart by a predetermined distance;
   one of said first and said second substantially planar reflecting surfaces being adapted to receiving said beam of electromagnetic radiation and reflecting said beam to at least one of said first and said second curved reflecting surfaces from which said beam is reflected to the other of said first and said second substantially planar surfaces; and
   a third substantially planar surface for reflecting said beam between one of said first and said second substantially planar surfaces and said at least one of said first and said second curved surfaces.

3. The apparatus of claim 2, wherein said third and said at least one of said first and said second substantially planar surfaces are not parallel.

4. The apparatus of claim 2, wherein the angle between said third and said at least one of said first and said second substantially planar surfaces is at least as great as 90 degrees.

5. An optical apparatus for projecting a beam of electromagnetic radiation comprising:
   a first substantially planar reflecting surface;
   a second substantially planar reflecting surface;
   a first concave curved reflecting surface;
   a second concave curved reflecting surface;
   the axis of said first and said second curved reflecting surfaces being substantially coincident;
   said first and said second curved reflecting surfaces being spaced apart by a predetermined distance;
   one of said first and said second substantially planar reflecting surfaces being adapted to receiving said beam of electromagnetic radiation and reflecting said beam to at least one of said first and said second curved reflecting surfaces from which said beam is reflected to the other of said first and said second substantially planar surfaces; and an object to be imaged in an object plane and a substrate on which said object is imaged.

6. An optical apparatus for projecting a beam of electromagnetic radiation comprising:

a first substantially planar reflecting surface;
a second substantially planar reflecting surface;
a first concave curved reflecting surface;
a second concave curved reflecting surface;
the axis of said first and said second curved reflecting surfaces being substantially coincident;
said first and second curved reflecting surfaces being spaced apart by a predetermined distance;
one of said first and said second substantially reflecting surfaces being adapted to receiving said beam of electromagnetic radiation and reflecting said beam to at least one of said first and said second curved reflecting surfaces from which said beam is reflected to the other of said first and said second substantially planar surfaces; and
a group of at least one lens for focusing said beam.

7. The apparatus of claim 6, wherein said group focuses said beam reflected from and to said at least one of said first and said second curved surfaces.

8. The apparatus of claim 2, further including a group of at least one lens for focusing said beam.

9. The apparatus of claim 8, wherein said group focuses said beam reflected from and to said at least one of said first and said second curved surfaces.

10. An optical apparatus for projecting a beam of electromagnetic radiation comprising:

a first substantially planar reflecting surface;
a second substantially planar reflecting surface;
a first concave curved reflecting surface;
a second concave curved reflecting surface;
the axis of said first and said second curved reflecting surfaces being substantially coincident;
said first and said second curved reflecting surfaces being spaced apart by a predetermined distance;
one of said first and said second substantially planar reflecting surfaces being adapted to receiving said beam of electromagnetic radiation and reflecting said beam to at least one of said first and said second curved reflecting surfaces from which said beam is reflected to the other of said first and said second substantially planar surfaces; and a third substantially planar reflecting surface for reflecting said beam to provide an even number of reflections.

11. The apparatus of claim 10, wherein said curved surfaces are substantially spherical.

12. The apparatus of claim 5, wherein said object to be imaged is a mask having predetermined regions opaque and translucent to said beam.

13. An optical apparatus for projecting a beam of electromagnetic radiation comprising:

a first substantially planar reflecting surface;
a second substantially planar reflecting surface;
a first concave curved reflecting surface;
a second concave curved reflecting surface;
the axis of said first and said second curved reflecting surfaces being substantially coincident;
said first and said second curved reflecting surfaces being spaced apart by a predetermined distance;
one of said first and said second substantially planar reflecting surfaces being adapted to receiving said beam of electromagnetic radiation and reflecting said beam to at least one of said first and said second curved reflecting surfaces from which said beam is reflected to the other of said first and said second substantially planar surfaces; and
wherein said beam is of a first wavelength which reflects from one of said first and second curved surfaces and wherein said beam is of a second wavelength which reflects from the other of said first and second curved surfaces.

14. The apparatus of claim 13, further including an image plane and an object plane and wherein said predetermined distance between said first and second curved surfaces permits the object and image plane of each of said wavelengths to be substantially at the same locations.

15. The apparatus of claim 13, further including an object to be imaged in an object plane and a substrate on which said object is imaged.

16. The apparatus of claim 15, wherein one of said first and second wavelengths is to align said object to said substrate and the other of said first and second wavelengths is to image said object on said substrate.

17. The apparatus of claim 1 wherein said beam is an optical beam.

18. An optical apparatus for projecting a beam of electromagnetic radiation comprising:

a first substantially planar reflecting surface;
a second substantially planar reflecting surface;
a first concave curved reflecting surface;
a second concave curved reflecting surface;
the axis of said first and said second curved reflecting surfaces being substantially coincident;
said first and said second curved reflecting surfaces being spaced apart by a predetermined distance;
one of said first and second substantially planar reflecting surfaces being adapted to receiving said beam of electromagnetic radiation and reflecting said beam to at least one of said first and said second curved reflecting surfaces from which said beam is reflected to the other of said first and said second substantially planar surfaces; and
wherein said beam is an ultraviolet beam.

19. The apparatus of claim 5, wherein said beam has a wavelength suitable to ablate said substrate to form an ablated image of said object.

20. The apparatus of claim 19, further including a transparent plate between said substrate and the remainder of said apparatus to prevent ablation debris from contacting the remainder of said apparatus.

21. The apparatus of claim 5, wherein said object and said substrate are adapted to be moved together to form said image on said substrate.

22. The apparatus of claim 5, wherein said object and said substrate are stationary and wherein the remainder of said apparatus is adapted to moved to image said object on said substrate.

23. The apparatus of claim 1, further including an aperture between said substantially planar surfaces and said curved surfaces.

24. The apparatus of claim 6, wherein said lens is a plano/convex lens.

25. An optical apparatus for projecting an alignment and image beam of electromagnetic radiation from an object onto a substrate comprising:

a first, a second and a third substantially planar mutually perpendicular reflecting surfaces;

a first and second concave reflecting surface having substantially the same axis and being spaced apart by a predetermined distance;

a plano/convex refracting element;

said first substantially planar surface being adapted to receiving said alignment and said image beams which are reflected to said second substantially planar surface from which one of said image and said alignment beams are reflected through said refracting element to one of said first and said second concave surfaces and the other of said image and alignment beams being reflected through said refracting element to the other of said first and second concave surfaces; and said image and said alignment beams being reflected from said first and said second concave surfaces through said refracting element to said third substantially planar surface and from said third surface onto said substrate.

26. An optical apparatus for projecting an alignment and image beam of electromagnetic radiation from an object onto a substrate comprising:

a first, second and a third substantially planar mutually perpendicular reflecting surfaces;

a first concave curved reflecting surface;

a second concave curved reflecting surface;

the axis of said first and said second curved reflecting surfaces being substantially coincident;

said first and said second curved reflecting surfaces being spaced apart by a predetermined distance;

a plano/convex refracting element;

one of said first and said second substantially planar reflecting surfaces being adapted to receiving at least one of said beams of electromagnetic radiation and reflecting said at least one of said beams to at least one of said first and said second curved reflecting surfaces through said plano/convex refracting element from which said beam is reflected to the other of said first and said second substantially planar surfaces through said plano/convex refracting element;

the other of said at least one beam reflecting off the other of said curved reflecting surface; and each of said alignment and said image beams reflecting off of said third planar surfaces.

* * * * *